US009424899B2

(12) United States Patent
Mazumder (10) Patent No.: US 9,424,899 B2
(45) Date of Patent: Aug. 23, 2016

(54) APPARATUSES AND METHODS FOR PROVIDING ACTIVE AND INACTIVE CLOCK SIGNALS TO A COMMAND PATH CIRCUIT

(71) Applicant: Micron Technology, Inc., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 14/022,102

(22) Filed: Sep. 9, 2013

(65) Prior Publication Data

US 2015/0071022 A1  Mar. 12, 2015

(51) Int. Cl.
*G11C 8/18* (2006.01)
*G11C 7/22* (2006.01)
*G11C 7/10* (2006.01)

(52) U.S. Cl.
CPC ............... *G11C 7/222* (2013.01); *G11C 7/109* (2013.01); *G11C 2207/2272* (2013.01)

(58) Field of Classification Search
None
See application file for complete search history.

(56) References Cited

U.S. PATENT DOCUMENTS

2014/0293719 A1* 10/2014 Jung ................... G11C 7/02
365/194

* cited by examiner

*Primary Examiner* — Kretelia Graham
(74) *Attorney, Agent, or Firm* — Dorsey & Whitney LLP (57) ABSTRACT

Apparatuses and methods for providing active and inactive clock signals to a command path circuit are described. An example method includes providing an active clock signal to a command path for a first portion of a command cycle for a command of back-to-back commands. The command path decodes the command and provides an output command signal responsive to the clock signal. The method further includes providing an inactive clock signal to the command path for a second portion of the command cycle for the command of the back-to-back commands.

17 Claims, 6 Drawing Sheets

APPARATUSES AND METHODS FOR PROVIDING ACTIVE AND INACTIVE CLOCK SIGNALS TO A COMMAND PATH CIRCUIT

BACKGROUND

Electronic memories are provided commands to perform memory operations. Examples of commands include read commands, which are provided to read data from the electronic memory, and write commands, which are provided to write data to the memory. The commands are provided to a command path circuit included in a memory, which typically decodes the commands and provides internal command signals to perform the memory operation. The command path circuit may operate according to various clock signals that clock the circuitry of the command path circuit in providing the internal command signals based on the command. Consecutive commands may be provided to the command path of the memory to perform consecutive memory operations. For example, consecutive read commands may be provided to the memory to consecutively read data from the memory. The consecutive commands may be spaced apart in time by several clock cycles, during which the command path and other memory circuitry carry out the consecutive memory operations. As with all memory operations, power is consumed while the memory operations are performed. In many applications, for example, in battery powered systems, it is desirable to reduce the power consumed during memory operation.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
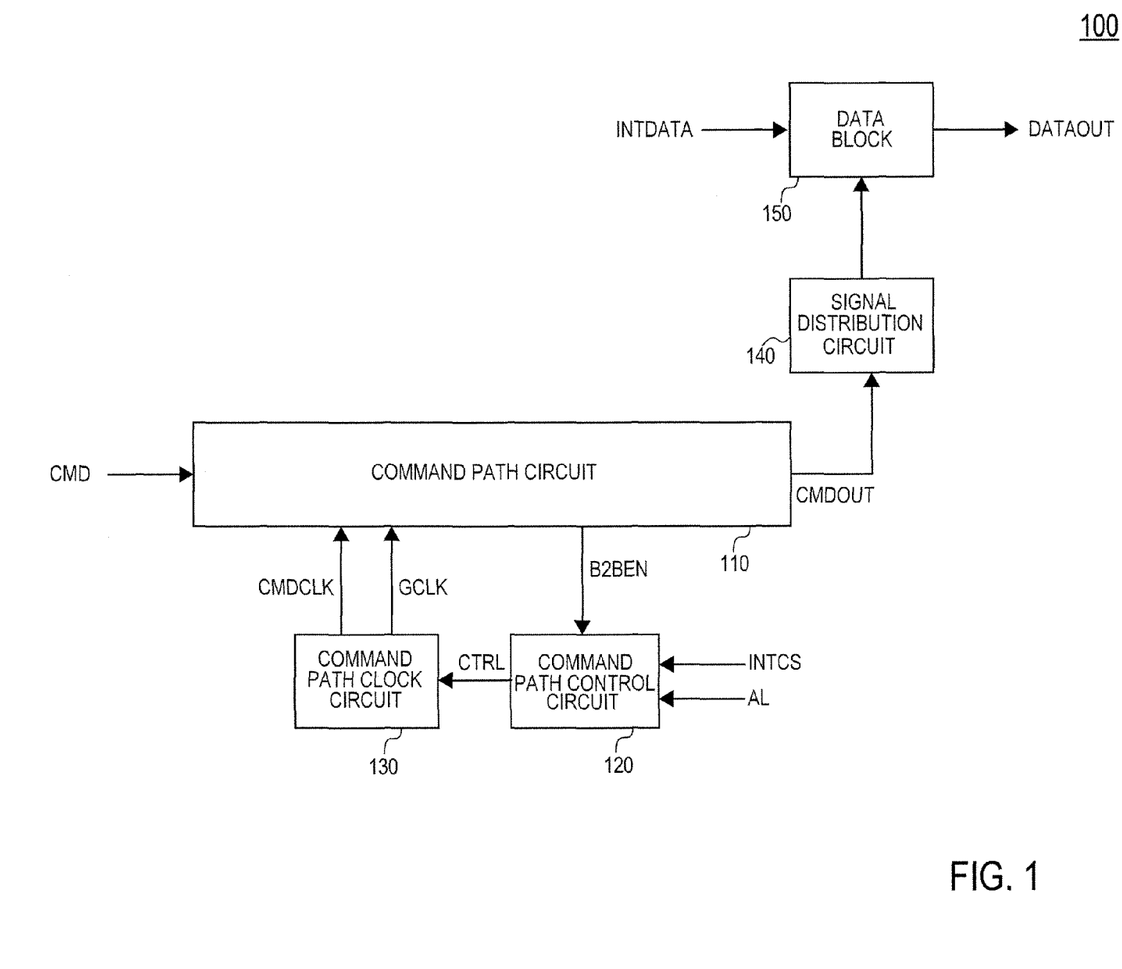
FIG. 1 is a block diagram of an apparatus that includes a command path circuit, a command path clock circuit, and a command path control circuit according to an embodiment of the invention.

FIG. 1 illustrates an apparatus 100 that includes a command path circuit 110 and a command path control circuit 120 according to an embodiment of the invention. As used herein, apparatus may refer to, for example, an integrated circuit, a memory device, a memory system, an electronic device or system, a smart phone, a tablet, a computer, a server, etc. The command path circuit 110 may receive a command CMD and provide an output command signal CMDOUT, for example, to a signal distribution circuit 140 that distributes the CMDOUT signal to circuits, such as the data block 150, to execute the memory operation of the command CMD. The data block 150 may be configured to receive internal data INTDATA, for example, data read from a memory array, and provide output data DATOUT responsive to the CMDOUT signal provided by the signal distribution circuit 140.

The command path circuit 110 may be configured to provide the CMDOUT signals having a timing appropriate to properly execute the memory operation. For example, the command path circuit 110 may be configured to add latency in providing the CMDOUT signals. As known, a "latency" may be programmed to set a time, typically in numbers of clock cycles tCK, between receipt of a command and when the CMDOUT signals are provided. The latency, which may include CAS latency (CL) and additive latency (AL) may be programmed by a user of the memory to accommodate clock signals of different frequencies (i.e., different clock periods), as well as timing of signals for proper operation, for example.

The command path circuit 110 may include different circuits to propagate the command CMD through the command path circuit 110 according to various clock signals. For example, a command path clock circuit 130 provides various clock signals to the command path circuit 110 to clock circuits of the command path circuit 110 to propagate the command CMD through the command path circuit 110 and provide the CMDOUT signal. In the embodiment illustrated in FIG. 1, the command path clock circuit 130 provides a command clock signal CMDCLK and a command interface clock signal GCLK to the command path circuit 110. Commands received by the command path circuit 110 are handled by the command path circuit 110 over the time of a command cycle. As a result, commands may be received at a maximum rate of one command per command cycle. A command cycle lasts for a number of clock cycles of a clock signal. For example, a command cycle may be four clock cycles long, during which a command is handled by the command path circuit 110. Thus, a command may be received every four clock cycles by the command path circuit 110. The example of a four clock cycle command cycle has been provided as an example, and command cycles of other lengths may be used as well. A command cycle may be the same for all commands received by the command path circuit 110, or in some embodiments, the commands may have different command cycles.

The command path control circuit 120 may be configured to control the command path clock circuit 130 in providing one or more of the clock signals to the command path circuit 110. For example, the command path control circuit 120 may provide a control signal CTRL to the command patch clock circuit 130 to control the command path clock circuit 130 to provide a clock signal that does not clock a circuit in the command path circuit 110, for example, by providing a clock signal that maintains a constant clock level rather than transitioning between high and low clock levels. A clock signal having a constant clock level during a clock cycle will be referred to as an inactive clock signal. In contrast, a clock signal that transitions between high and low clock levels during a clock cycle will be referred to as an active clock signal. An internal chip select signal INTCS is provided to the command path control circuit 120 to indicate when clock signals may need to be provided to the command path circuit 110. An active INTCS signal may be provided, for example, when an active chip select signal CS is provided to a memory including the command path circuit 110 and the command path control circuit 120, which indicates that a command may soon be provided to the memory. The command path control circuit 120 may further receive an additive latency signal AL that is indicative of number of additional clock signals for an additive latency. The AL signal may be based on information (e.g., a number of clock signals of additive latency) programmed in a mode register (not shown) by a user of the memory.

In some embodiments, the command path control circuit 120 may be configured to control the command path clock circuit 130 to provide an inactive clock signal responsive to a command or sequence of commands. For example, the command path control circuit 120 may control the command path clock circuit 130 to provide an active clock signal for a portion of a command cycle of a command and also to provide an inactive clock signal for another portion of the command cycle responsive to continuous consecutive commands. Continuous consecutive commands may be consecutive commands provided without any time gap between the consecutive commands. Continuous consecutive commands may be referred to as "back-to-back" commands. An example of back-to-back commands is back-to-back read commands which are consecutive read commands that are provided without any time gap between the consecutive read commands. Other commands may be provided back-to-back as well without departing from the scope of the present invention. In some embodiments, in addition, or in the alternative, to being responsive to a command or sequence of commands, an inactive clock signal or signals may be provided to the command path circuit 110 responsive to an operating condition. For example, an inactive clock signal or signals may be provided to the command path circuit 110 responsive to the additive latency being zero (e.g., AL=0), indicating that no additive latency is to be added. Not adding any additive latency may eliminate the need for a clock signal that is used to add the additive latency, such as by clocking a circuit adding the latency, to be active. The AL signal provided to the command path control circuit 120 may indicate an AL=0, and the command path control circuit 120 may control the command path clock circuit 130 to provide an inactive clock signal to the command path circuit 110, since an active clock signal may not be needed to add any additive latency.

The command path circuit 110 may be configured to detect back-to-back commands and provide an active back-to-back enable signal B2BEN responsive to detecting back-to-back commands. The B2BEN signal may be used to control the command path control circuit 120 to control the command path clock circuit 130 to provide an inactive clock signal to the command path circuit 110. As a result, when back-to-back commands are detected, inactive clock signals may be provided for one or more of the clock signals provided to the command path circuit 110 responsive to back-to-back commands. Providing inactive clock signals to the command path circuit 110 may reduce power consumption in propagating a command through the command path circuit 110 compared to providing an active clock signal having continuously transitioning clock cycles for an entire command cycle. In other embodiments, an inactive clock signal or signals may be provided to the command path circuit 110 responsive to a command or sequence of commands in combination with the additive latency being zero. For example, an AL signal indicating AL=0 and a B2BEN signal indicating detection of back-to-back commands may be provided to the command path control circuit 120. As a result, the command path control circuit 120 may control the command path clock circuit 130 to provide an inactive clock signal to the command path circuit 110.

In some embodiments, the command path control circuit 120 may be configured to control the command path clock circuit 130 to provide to the command path circuit 110 an inactive CMDCLK signal and an inactive GCLK signal for a portion of a command cycle for back-to-back commands. For example, assuming a command cycle of four clock cycles, the command path control circuit 120 may be configured to control the command path clock circuit 130 to provide the command path circuit 110 with an active CMDCLK signal for two clock cycles and an inactive CMDCLK signal for two clock cycles of the command cycle for back-to-back read commands. The command path control circuit 120 may be further configured to control the command path clock circuit 130 to provide the command path circuit 110 with an active GCLK signal for two clock cycles and an inactive GCLK signal for two clock cycles of a command cycle for back-to-back read commands. Other numbers of active and inactive clock signals may be provided as well. For example, in some embodiments, assuming a four clock cycle command cycle, the command path control circuit 120 may be configured to control the command path clock circuit 130 to provide the command path circuit 110 with an active GCLK signal for one clock cycle and an inactive GCLK signal for three clock cycles of a command cycle for back-to-back read commands.

Figure 2:
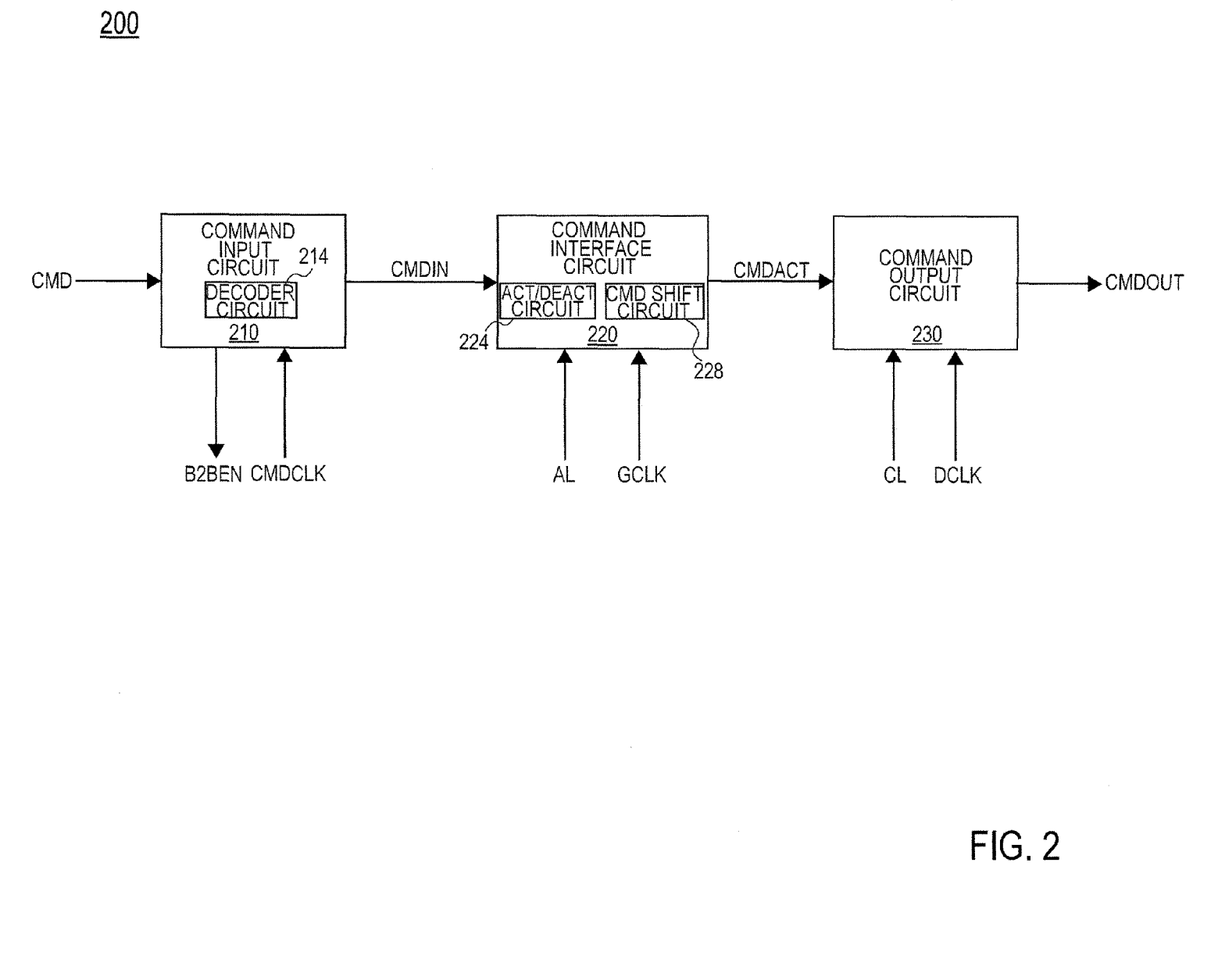
FIG. 2 is a block diagram of a command path circuit according to an embodiment of the invention.

FIG. 2 illustrates a command path circuit 200 according to an embodiment of the invention. In some embodiments, the command path circuit 200 may be used as the command path circuit 110 of FIG. 1. The command path circuit 200 includes a command input circuit 210 configured to decode a command CMD to provide an internal command signal CMDIN. A command clock signal CMDCLK provided to the command input circuit 210 clocks the command input circuit 210 to decode the command CMD to provide the CMDIN signal. The CMDCLK signal may be provided by a command path clock circuit (e.g., command path clock circuit 130 of FIG. 1). The command input circuit 210 may include a command decoder circuit 214 configured to decode the command CMD responsive to the CMDCLK signal. A number of clock cycles of the CMDCLK signal may be needed for the command decoder circuit 214 to decode the command CMD to provide the CMDIN signal. For example, in some embodiments, the command decoder circuit 214 decodes the command CMD using two clock cycles of the CMDCLK signal when providing the CMDIN signal. In some embodiments, the command decoder circuit 214 may decode the command CMD responsive to a first clock cycle of the CMDCLK signal to provide the CMDIN signal, and the command decoder circuit 214 is prepared for decoding a subsequent command (e.g., precharged) responsive to a second clock cycle of the CMDCLK signal. An example of a command decoder circuit that is responsive to first and second clock cycles of a CMDCLK signal is a dynamic decoder. Other decoder circuits may be used, however, and operate responsive to a different number of clock cycles of the CMDCLK signal than described in the previous example.

The command input circuit 210 may be further configured to detect back-to-back commands and provide an active B2BEN signal when back-to-back commands are detected. The B2BEN signal may be provided, for example, to a command path control circuit (e.g., command path control circuit 120 of FIG. 1). In some embodiments, the command input circuit 210 may detect back-to-back commands based on a plurality of commands CMD that are immediately consecutive. For example, a first command and a second command are received by the command input circuit 210 consecutively and without any time gap between the first and second commands. The first and second commands may be both read commands, and thus represent back-to-back read commands. When back-to-back commands are detected, the command input circuit 210 provides an active B2BEN signal.

The command path circuit 200 further includes a command interface circuit 220 to which the CMDIN signal is provided. The command interface circuit 220 may be configured to provide additive latency to the CMDIN signal in providing a command activation signal CMDACT. The additive latency may be indicated by an additive latency signal AL provided to the command interface circuit 220. A command interface clock GCLK provided to the command interface circuit 220 clocks the command interface circuit to provide the CMDACT signal with additive latency indicated by the AL signal. The GCLK signal may be provided by a command path clock circuit (e.g., command path clock circuit 130 of FIG. 1).

The command interface circuit 220 may include an activation/deactivation circuit 224 configured to provide the CMDACT signal responsive to being clocked by the GCLK signal. A number of clock cycles of the GCLK signal may be needed by the activation/deactivation circuit 224 to provide the CMDACT signal. For example, in some embodiments, the activation/deactivation circuit 224 may include a latch, and be configured to set the latch (not shown) responsive to a first clock cycle of the GCLK signal and reset the latch responsive to a second clock cycle of the GCLK signal to provide the CMDACT signal. Other activation/deactivation circuits may be used as well, and operate responsive to a different number of clock cycles of the GCLK signal than described in the previous example. For example, in some embodiments, circuitry of the command interface circuit may provide the CMDACT signal based on the CMDIN signal responsive to one clock cycle of the GCLK signal. The command interface circuit 220 may further include a command shift circuit 228 configured to shift the CMDACT signal according to the GCLK signal to provide the additive latency indicated by the AL signal.

The command interface circuit 220 provides the CMDACT signal to a command output circuit 230 that is configured to provide an output command signal CMDOUT based on the CMDACT signal, and having a CAS latency as indicated by a CAS latency signal CL. A command output clock signal DCLK provided to the command output circuit 230 clocks the command output circuit 230 to provide the CMDOUT signal having the indicated CAS latency. The DCLK signal may be provided by a clock circuit, including in some embodiments a command path clock circuit. Other clock circuits may provide the DCLK signal as well, however. As previously discussed, the CMDOUT signal may be provided through a signal distribution circuit (e.g., signal distribution circuit 140 of FIG. 1) to circuitry that may operate according to the CMDOUT signal.

As previously discussed, an inactive clock signal or signals (e.g., CMDCLK signal and/or GCLK signal) may be provided responsive to the additive latency being zero, as indicated, for example, by the AL signal indicating zero clock cycles. The AL signal may also be provided to a command path control circuit to control a command path clock circuit (e.g., command path control circuit 110 and command path clock circuit 130 of FIG. 1). An inactive clock signal or signals may be provided responsive to the additive latency being zero (as indicated by an AL signal provided to a command path control circuit) in combination with a command or sequence of commands, such as back-to-back commands, as indicated, for example, by an active B2BEN signal (also provided to the command path control circuit) from the command input circuit 210.

In operation, the command decoder circuit 214 of the command input circuit 210 decodes a command CMD responsive to the CMDCLK signal, and the command input circuit 210 provides the CMDIN signal to the command interface circuit 220. The activation/deactivation circuit 224 provides a CMDACT signal based on the CMDIN signal and responsive to the GCLK signal. The CMDACT signal may be provided to the command shift circuit 228, which may add additive latency as indicated by the AL signal to the CMDACT signal before the command interface circuit 220 provides the CMDACT signal to the command output circuit 230. Responsive to the DCLK signal, the command output circuit 230 provides the CMDOUT signal based on the CMDACT signal, and having the CAS latency as indicated by the CL signal.

As previously discussed, the command path circuit 200 may include circuits that operate responsive to a number of clock cycles in providing the CMDOUT signal. For example, the command input circuit 210 may include a command decoder circuit 214 that uses two clock cycles of the CMDCLK to decode a command CMD and provide the CMDIN signal. Where a length of a command cycle is greater than the number of clock cycles needed by a circuit of the command path circuit 200 to operate, the number of clock cycles of a clock signal provided to the circuit may be controlled such that an inactive clock signal is provided to the circuit for at least a portion of the command cycle. Since the number of clock cycles used by the circuit to operate is less than the number of clock cycles of the command cycle, the circuit may operate properly even if the clock signal is not active throughout the length of the command cycle.

Figure 3:
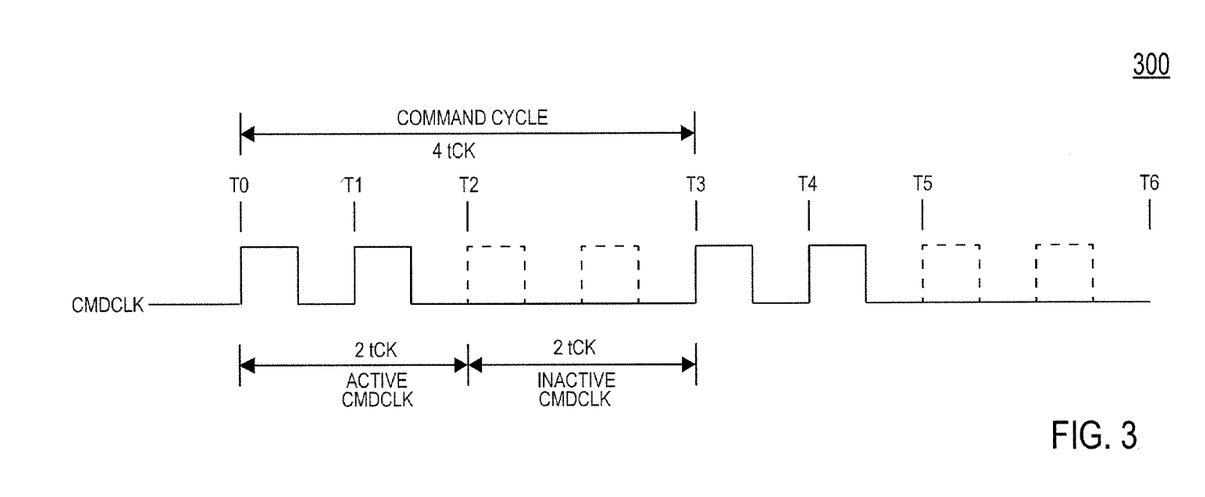
FIG. 3 is a timing diagram of a command path clock signal according to an embodiment of the invention.

For example, with reference to the timing diagram of FIG. 3, a command cycle is assumed to have a length of four clock cycles (tCKs). Further assuming an embodiment of a command path circuit including a command input circuit that uses two clock cycles of the CMDCLK to decode to provide a CMDIN signal, an active CMDCLK signal may be provided to the command input circuit for two clock cycles and an inactive CMDCLK signal may be provided to the command input circuit for the remainder of the command cycle, that is, two clock cycles. At time T0, for example, a command decoder circuit of the command input circuit may decode the command CMD, and at time T1, the command decoder circuit may be precharged in preparation for decoding a subsequent command. After the command decoder circuit is precharged, an inactive CMDCLK signal may be provided to the command input circuit, for example, between times T2 and T3. FIG. 300 illustrates in dashed lines two clock cycles of the CMDCLK signal between times T2 and T3, during which the inactive CMDCLK signal is provided instead of an active CMDCLK signal. Assuming back-to-back commands, the command input circuit may decode an immediately consecutive command and provide a CMDIN signal responsive to another two clock cycles of the CMDCLK signal, as shown by clock cycles at times T3 and T4. Again, following the two clock cycles of an active CMDCLK signal, two clock cycles of an inactive CMDCLK may be provided to the command input circuit, such as between times T5 and T6. Providing an inactive CMDCLK signal to the command input circuit, for example, for back-to-back commands, may reduce power consumption compared to providing an active CMDCLK signal throughout a command cycle.

In addition, or in alternative, to providing an inactive CMDCLK for a portion of a command cycle, for a command path circuit that includes a command interface circuit that is provided a CMDIN signal and uses two clock cycles of the GCLK signal to provide the CMDACT signal (assuming AL=0), an active GCLK signal may be provided to the command interface circuit for two clock cycles and an inactive GCLK signal may be provided to the command interface circuit for the remainder of the command cycle, that is, two clock cycles of the GCLK signal.

Figure 4:
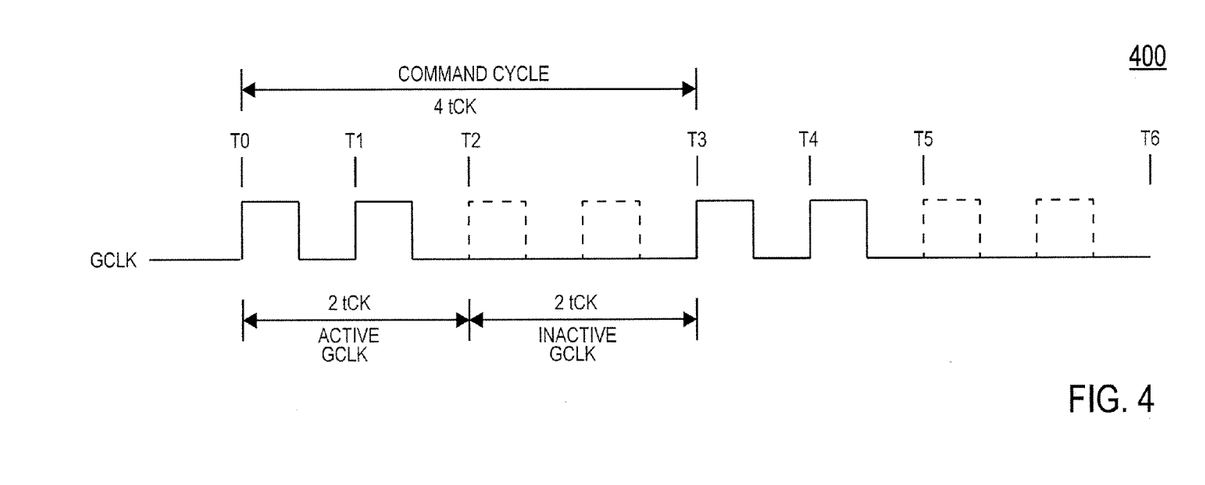
FIG. 4 is a timing diagram of a command path clock signal according to an embodiment of the invention.

FIG. 4 illustrates a timing diagram for an example where an active GCLK signal is provided to the command interface circuit for two clock cycles, and an inactive GCLK signal is provided to the command interface circuit for two clock cycles. At time T0, for example, an activation/deactivation circuit of the command interface circuit that is provided a CMDIN signal may set a latch at time T0 responsive to a first clock cycle of the GCLK signal, and reset the latch at time T1 responsive to a second clock cycle of the GCLK signal to provide a CMDACT signal. Where AL=0 (e.g., for back-to-back commands), the CMDACT signal may be provided by the command interface circuit without any additive latency. An inactive GCLK signal may be provided to the command interface circuit, for example, between times T2 and T3. FIG. 400 illustrates in dashed lines two clock cycles of the GCLK signal between times T2 and T3, during which the inactive GCLK signal is provided instead of an active GCLK signal. Assuming back-to-back commands, the command interface circuit may be provided a CMDIN signal for an immediately consecutive command, and set the latch at time T3 and reset the latch at time T4 to provide the CMDACT signal. Following the two clock cycles of an active GCLK signal, two clock cycles of an inactive GCLK may be provided to the command interface circuit, such as between times T5 and T6. Providing an inactive GCLK signal to the command interface circuit, for example, for back-to-back commands, may reduce power consumption compared to providing an active GCLK signal throughout a command cycle.

Figure 5:
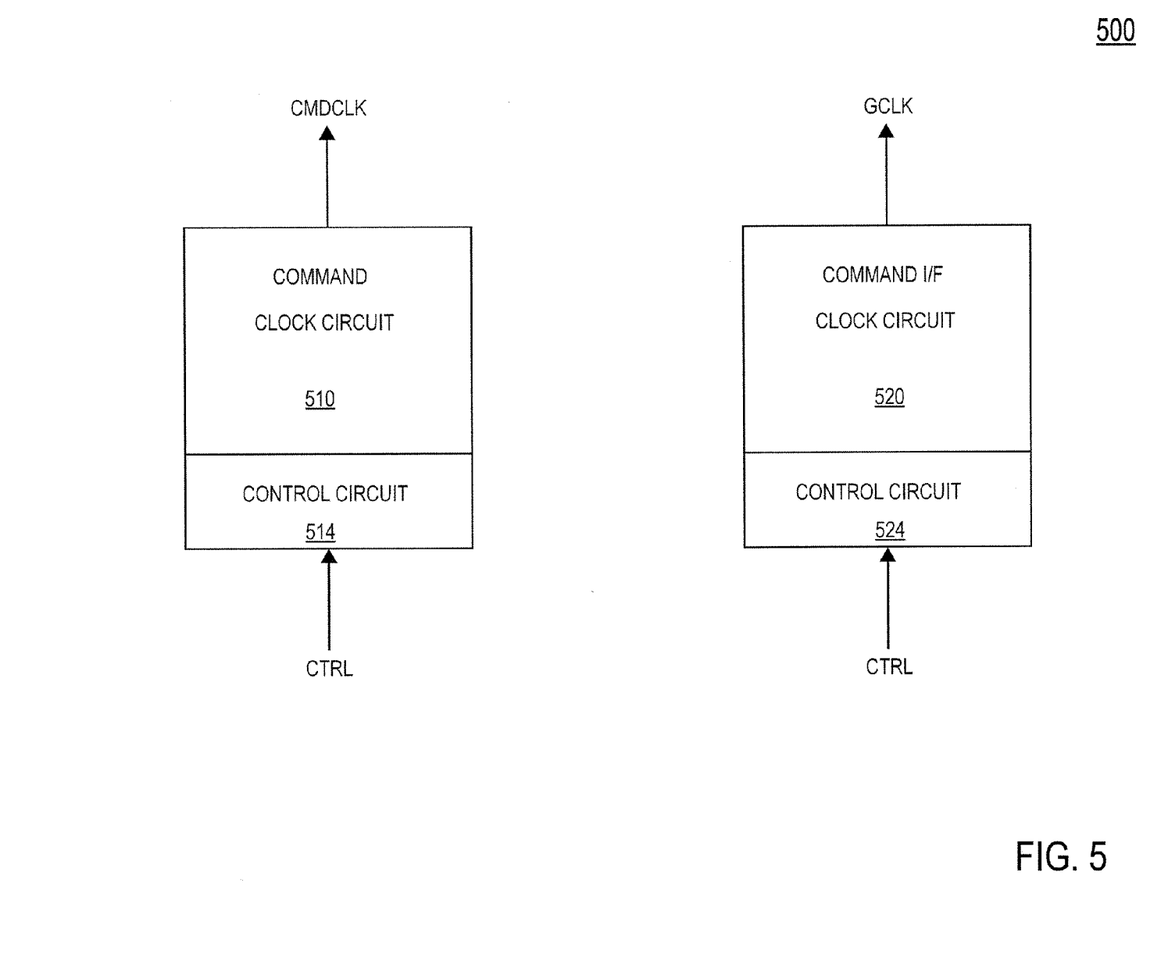
FIG. 5 is a block diagram of a command path clock circuit according to an embodiment of the invention.

FIG. 5 illustrates a command path clock circuit 500 according to an embodiment of the invention. In some embodiments, the command path clock circuit 500 may be used as the command path clock circuit 130 included in the apparatus 100. The command path clock circuit 500 includes a command clock circuit 510 and a command clock circuit control circuit 514. The command clock circuit 510 may be configured to provide a command clock signal CMDCLK, as controlled by the control circuit 514. The control circuit 514 may control the command clock circuit 510 to provide an active CMDCLK signal or an inactive CMDCLK signal responsive to a control signal CTRL (e.g., provide by a command path control circuit). For example, responsive to the CTRL signal having a first logic level the control circuit 514 may control the command clock circuit 510 to provide an active CMDCLK signal, and responsive to the CTRL signal having a second logic level the control circuit 514 may control the command clock circuit 510 to provide an inactive CMDCLK signal.

The command path clock circuit 500 further includes a command interface (I/F) clock circuit 520 and a command I/F clock circuit control circuit 524. The command I/F clock circuit 520 may be configured to provide a command interface clock signal GCLK, as controlled by the control circuit 524. The control circuit 524 may control the command I/F clock circuit 520 to provide an active GCLK signal or an inactive GCLK signal responsive to the CTRL signal. For example, responsive to the CTRL signal having a first logic level the control circuit 524 may control the command I/F clock circuit 520 to provide an active GCLK signal, and responsive to the CTRL signal having a second logic level the control circuit 524 may control the command clock circuit 520 to provide an inactive GCLK signal.

As previously discussed, an inactive clock signal (e.g., the CMDCLK signal and/or the GCLK signal) may be provided for a portion of a command cycle. An active clock signal may be provided for another portion of the command cycle. By providing an inactive clock signal, power consumption may be reduced compared to providing an active clock signal throughout an entire command cycle.

Figure 6:
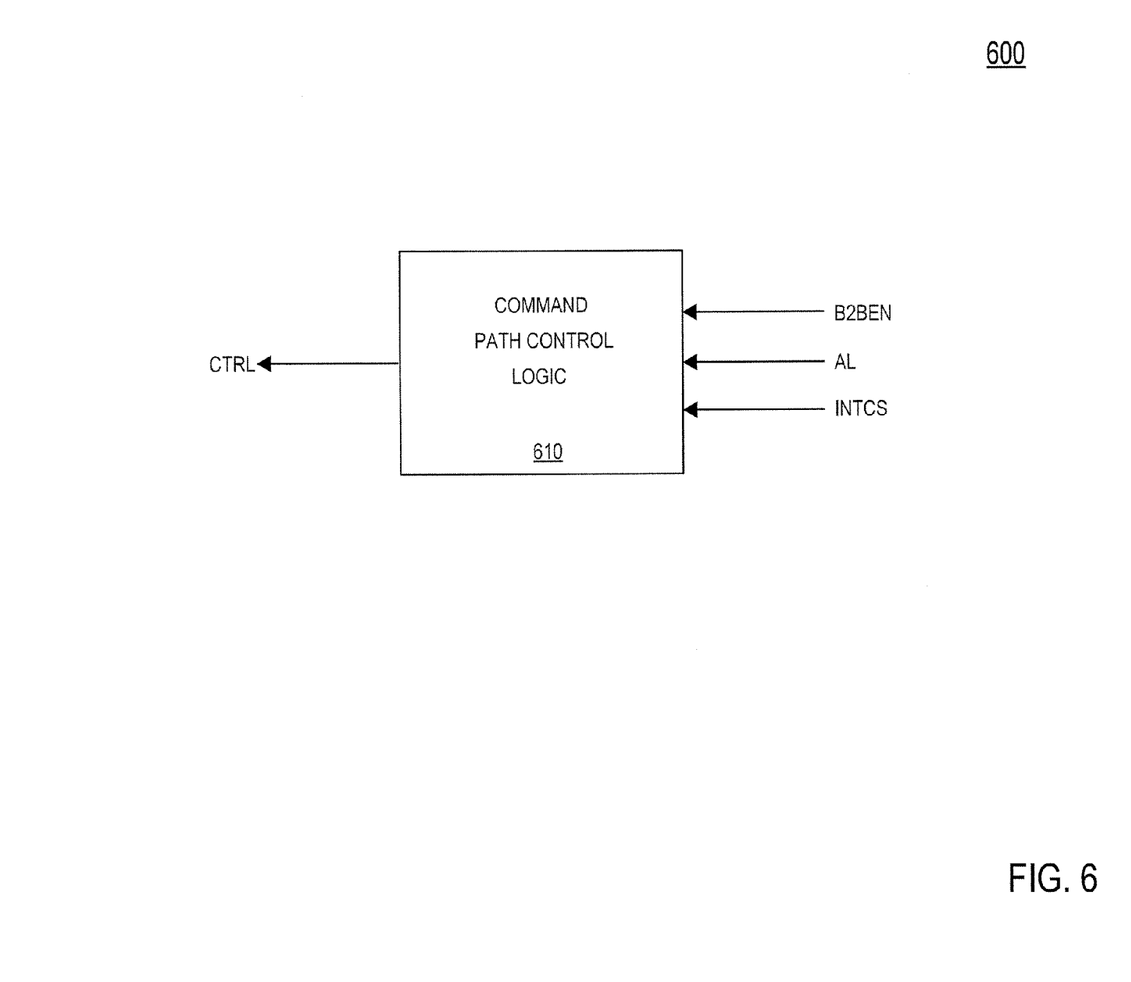
FIG. 6 is a block diagram of a command path control circuit according to an embodiment of the invention.

FIG. 6 illustrates a command path control circuit 600 according to an embodiment of the invention. In some embodiments, the command path control circuit 600 may be used as the command path control circuit 120 included in the apparatus 100. The command path control circuit 600 includes command path logic 610. The command path logic 610 may be provided a back-to-back enable signal B2BEN, an internal chip select signal INTCS, and an additive latency signal AL. The command path logic 610 may provide a control signal CTRL based on the B2BEN, INTCS, and AL signals, which may be used, for example, to control a command path clock circuit (e.g., command path clock circuit 130 of FIG. 1) to provide inactive clock signals. The CTRL signal may include one or more separate signals that are used to control provision of one or more clock signals by a command path clock circuit.

An active B2BEN signal indicates when back-to-back commands have been detected, for example, by a command path circuit (e.g., command path circuit 110 of FIG. 1). The INTCS signal indicates when clock signals may need to be provided to a command path circuit, for example, by a command path clock circuit (e.g., command path circuit 130 of FIG. 1) that may be controlled by the command path control circuit 600. The AL signal indicates a number of clock cycles to be added as additive latency. As previously discussed, the CTRL signal provided by the command path control logic 610 may be used to control a command path clock circuit, such as an active CTRL signal controls the command path clock circuit to provide an active clock signal whereas an inactive CTRL signal controls the command path clock circuit to provide an inactive clock signal.

In operation, the command path control logic 610 provides an active CTRL signal responsive to an active INTCS signal, which indicates that clock signals need to be provided to the command path circuit, and an inactive B2BEN signal, which indicates that back-to-back commands have not been detected. The AL signal typically indicates a non-zero number of clock cycles to be added as additive latency when back-to-back commands are not provided (e.g., inactive B2BEN signal). However, when an active INTCS signal and an active B2BEN signal are provided to the command path control logic 610, which indicate that clock signals need to be provided to the command path circuit and that back-to-back commands have been detected, the command path control logic 610 provides an inactive CTRL signal for at least a portion of a command cycle. In some embodiments, the command path control logic 610 provide an inactive CTRL signal for active INTCS and B2BEN signals in combination with an AL signal indicating zero clock cycles, which indicates no clock cycles are to be added as additive latency. The inactive CTRL signal may control a command path clock circuit to provide an inactive clock signal for the portion of the command cycle. Also responsive to active INTCS and B2BEN signals, and in some embodiments, in combination with an AL signal indicating zero clock cycles, an active CTRL signal may be provided by the command path control logic 610 for a portion of the command cycle as well. When an inactive INTCS signal is provided to the command path control logic 610, which indicates that a clock signal is not needed, the command path control logic 610 provides an inactive CTRL signal, which may control a command path clock circuit to provide an inactive clock signal.

Figure 7:
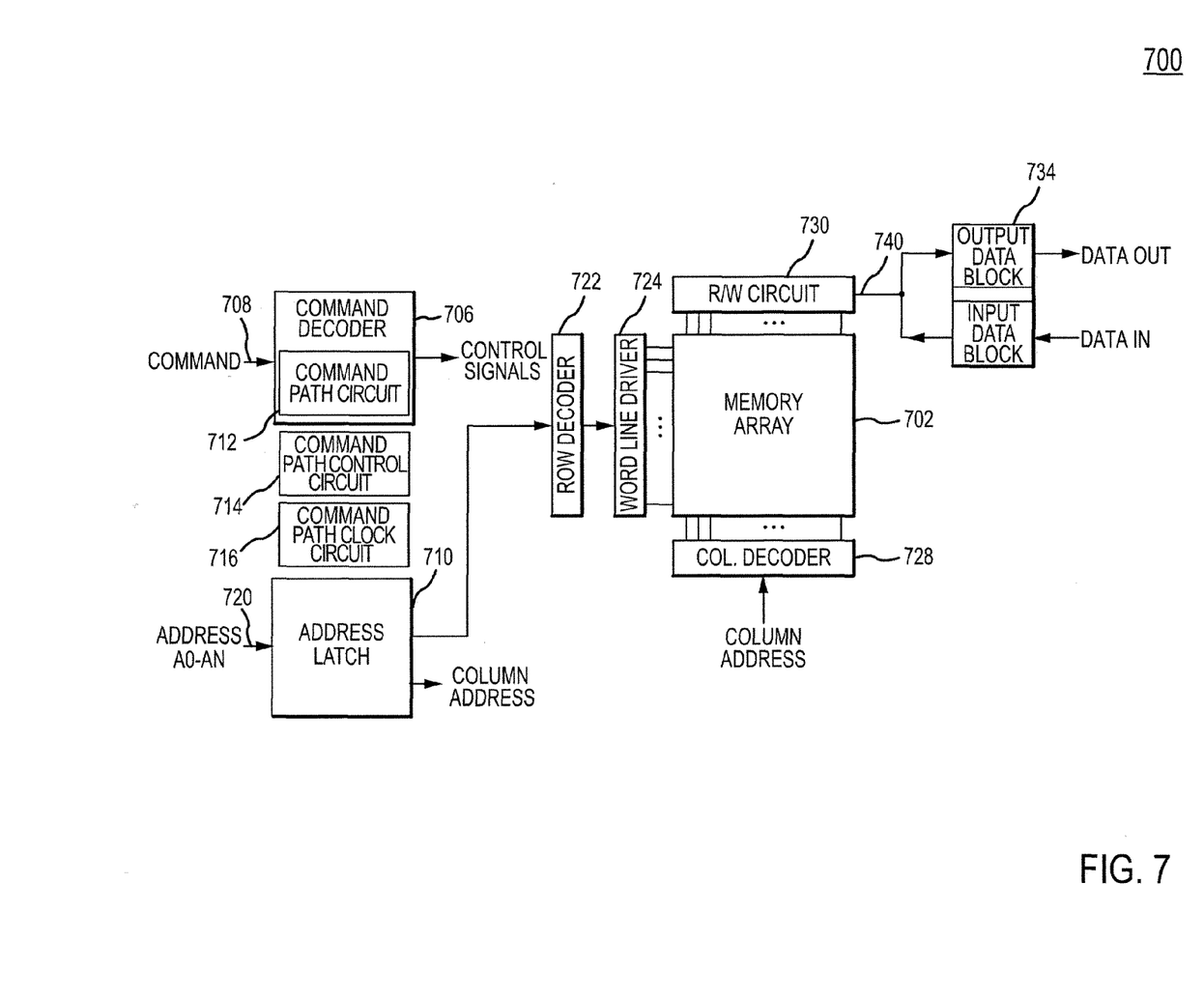
FIG. 7 is a block diagram of a memory according to an embodiment of the invention.

FIG. 7 illustrates a portion of a memory 700 according to an embodiment of the present invention. The memory 700 includes an array 702 of memory cells, which may be, for example, volatile memory (e.g., DRAM memory cells, SRAM memory cells), non-volatile memory (e.g., flash memory cells), or some other types of memory cells. The memory 700 includes a command decoder 706 that receives memory commands through a command bus 708 and provides (e.g. generates) corresponding control signals within the memory 700 to carry out various memory operations. Row and column address signals are provided (e.g., applied) to the memory 700 through an address bus 720 and provided to an address latch 710. The address latch then outputs a separate column address and a separate row address.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to an input/output data block 734 via an input-output data bus 740. Write data are provided to the memory array 702 through the I/O data block 734 and the memory array read/write circuitry 730.

The memory 700 further includes command path circuit 712, command path control circuit 714, and command path clock circuit 716 according to an embodiment of the invention. The command path circuit 110, command path control circuit 120, and command path clock circuit 130 of FIG. 1 may be used for the command path circuit 712, command path control circuit 714, and command path clock circuit 716, for example. In some embodiments, the command path circuit 712 may be included in the command decoder 706, as shown in FIG. 7, however, the command path circuit 712 may also be separate from the command decoder 706. The command decoder 706 responds to memory commands provided to the command bus 708 to perform various operations on the memory array 702. In particular, the command decoder 706 is used to provide internal control signals to read data from and write data to the memory array 702.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a command path circuit configured to receive a command, and further configured to decode the command to provide an output command responsive to a clock signal;
a command path clock circuit configured to provide the clock signal to the command path circuit; and
a command path control circuit configured to control the command path clock circuit to provide an inactive clock signal to the command path circuit for a portion of a command cycle of the command and to provide an active clock signal for another portion of the command cycle, wherein the clock signal is a command clock signal, and the command path clock circuit is further configured to provide a command interface clock signal to the command path circuit.

2. An apparatus, comprising:
a command path circuit configured to receive a command, and further configured to decode the command to provide an output command responsive to a clock signal;
a command path clock circuit configured to provide the clock signal to the command path circuit; and
a command path control circuit configured to control the command path clock circuit to provide an inactive clock signal to the command path circuit for a portion of a command cycle of the command and to provide an active clock signal for another portion of the command cycle, wherein the clock signal comprises a command clock signal and a command interface clock signal, and wherein the command path circuit comprises:
a command input circuit configured to decode the command and provide an internal command signal responsive to the command clock signal;
a command interface circuit coupled to the command input circuit and configured to receive the internal command signal and provide a command activation signal responsive to the command interface clock signal, the command activation signal provided by the command interface circuit having additive latency as indicated by an additive latency signal provided to the command interface circuit; and
a command output circuit coupled to the command interface circuit and configured to provide an output command signal based on the command activation signal responsive to an output clock signal.

3. The apparatus of claim 2 wherein the command path clock circuit is configured to provide the command clock signal to the command input circuit, and wherein the command path control circuit is configured to control the command path clock circuit to provide an inactive command clock signal for a portion of the command cycle and to provide an active command clock signal for another portion of the command cycle.

4. The apparatus of claim 2 wherein the command path clock circuit is configured to provide the command interface clock signal to the command interface circuit, and wherein the command path control circuit is configured to control the command path clock circuit to provide an inactive command interface clock signal for a portion of the command cycle and to provide an active command interface clock signal for another portion of the command cycle.

5. The apparatus of claim 2 wherein the command input circuit comprises:
a decoder circuit configured to decode the command responsive to a first clock cycle of the command clock signal and configured to be prepared for decoding a subsequent command responsive to a second clock cycle of the command clock signal.

6. The apparatus of claim 2 wherein the command interface circuit comprises:
an activation/deactivation circuit including a latch, the latch configured to be set responsive to a first clock cycle of the command interface clock signal and the latch configured to be reset responsive to a second clock cycle of the command interface clock signal.

7. An apparatus, comprising:
a command path circuit configured to receive a command, and further configured to decode the command to provide an output command responsive to a clock signal;
a command path clock circuit configured to provide the clock signal to the command path circuit; and
a command path control circuit configured to control the command path clock circuit to provide an inactive clock signal to the command path circuit for a portion of a command cycle of the command and to provide an active clock signal for another portion of the command cycle, wherein the command path control circuit is configured to control the command path clock circuit to provide the inactive clock signal for the portion of the command cycle responsive to back-to-back commands received by the command path circuit.

8. An apparatus, comprising:

a command path circuit configured to receive a command, and further configured to decode the command to provide an output command responsive to a clock signal;

a command path clock circuit configured to provide the clock signal to the command path circuit; and a command path control circuit configured to control the command path clock circuit to provide an inactive clock signal to the command path circuit for a portion of a command cycle of the command and to provide an active clock signal for another portion of the command cycle, wherein the command path control circuit is configured to control the command path clock circuit to provide the inactive clock signal for the portion of the command cycle responsive to a zero additive latency.

9. An apparatus, comprising:

a command path circuit configured to receive a command, and further configured to decode the command to provide an output command responsive to a clock signal;

a command path clock circuit configured to provide the clock signal to the command path Circuit; and a command path control circuit configured to control the command path clock circuit to provide an inactive clock signal to the command path circuit for a portion of a command cycle of the command and to provide an active clock signal for another portion of the command cycle, wherein the clock signal comprises a command clock signal and wherein the command path clock circuit comprises:

a command clock circuit configured to provide the command clock. signal to the command path circuit; and a command clock control circuit coupled to the command clock circuit and configured to control the command clock circuit to provide an active command clock signal or an inactive command clock signal.

10. An apparatus, comprising:

a command path circuit configured to receive a command, and further configured to decode the command to provide an output command responsive to a clock signal;

a command path clock circuit configured to provide the clock signal to the command path circuit; and a command path control circuit configured to control the command path clock circuit to provide an inactive clock signal to the command path circuit for a portion of a command cycle of the command and to provide an active clock signal for another portion of the command cycle, wherein the clock signal comprises a command interface clock signal and wherein the command path clock circuit comprises:

a command interface clock circuit configured to provide the command interface clock signal to the command path circuit; and a command interface clock control circuit coupled to the command interface clock circuit and configured to control the command interface clock circuit to provide an active command interface clock signal or an inactive command interface clock signal.

11. An apparatus, comprising:

a command input circuit configured to decode commands responsive to a command clock signal and provide internal command signals;

a command path clock circuit configured to provide active and inactive command clock signals to the command input circuit; and responsive to back-to-back commands, a control circuit configured to control the command path clock circuit to provide an active command clock signal to the command input circuit to decode a command of the back-to-back commands, and the control circuit further configured to provide an inactive command clock signal to the command input circuit for a portion of a command cycle of the command of the back-to-back commands.

12. The apparatus of claim 11 wherein the command input circuit is configured to detect back-to-back commands and provide an active back-to-back enable signal to the control circuit the responsive thereto.

13. The apparatus of claim 11 wherein the command input circuit comprises a dynamic decoder circuit configured to decode commands responsive to the command clock signal.

14. An apparatus, comprising:

a command interface circuit configured to provide command activation signals based on, internal command signals and responsive to a command interface clock signal;

a command path clock circuit configured to provide active and inactive command interface clock signals to the command interface circuit; and responsive to back-to-back commands, a control circuit configured to control the command path clock circuit to provide an active command interface clock signal to the command input circuit to provide a command activation signal for a command of the back-to-back commands, and the control circuit further configured to provide an inactive command interface clock signal to the command interface circuit for a portion of a command cycle of the command of the back-to-back commands.

15. The apparatus of claim 14 wherein the control circuit is configured to control the command path clock circuit to provide an active command interface clock signal to the command interface circuit for two clock cycles, and further configured to control the command path clock circuit to provide an inactive command interface clock signal for the remainder of the command cycle.

16. The apparatus of claim 14 wherein the control circuit is configured to control the command path clock circuit to provide an active command interface clock signal to the command interface circuit for one clock cycle, and further configured to control the command path clock circuit to provide an inactive command interface clock signal for the remainder of the command cycle.

17. The apparatus of claim 14 wherein the command interface circuit comprises a latch configured to be set and reset responsive to an active command interface clock signal.

* * * * *